United States Patent [19]
van Bavel

[11] Patent Number: 4,876,543
[45] Date of Patent: Oct. 24, 1989

[54] MULTI-RATE CASCADED NOISE SHAPING MODULATOR

[75] Inventor: Nicholas R. van Bavel, Austin, Tex.

[73] Assignee: Motorola, Inc., Schaumburg, Ill.

[21] Appl. No.: 200,475

[22] Filed: May 31, 1988

[51] Int. Cl.$^4$ ............................................. H03M 3/00
[52] U.S. Cl. .................................. 34.1/143; 341/123; 341/200
[58] Field of Search ............... 341/122, 123, 143, 144, 341/155, 158, 166, 167, 200; 375/27, 28, 33; 364/724.04; 332/11 D

[56] References Cited

U.S. PATENT DOCUMENTS

| | | | |
|---|---|---|---|
| 4,281,318 | 7/1981 | Candy et al. | 341/61 |
| 4,301,446 | 11/1981 | Petit | 341/143 |
| 4,439,756 | 3/1984 | Shenoi et al. | 340/347 AD |
| 4,528,551 | 7/1985 | Agrawal et al. | 341/143 |
| 4,588,979 | 5/1986 | Adams | 340/347 AD |
| 4,588,981 | 5/1986 | Senn | 341/167 |
| 4,600,901 | 7/1986 | Rabaey | 332/11 D |
| 4,684,925 | 8/1987 | Maruta | 340/347 AD |
| 4,704,600 | 11/1987 | Uchimura et al. | 340/347 AD |

OTHER PUBLICATIONS

"Decimation for Sigma Delta Modulation" by Candy, IEEE Transactions on Communications, Vol. CO-M-34, No. 1, Jan., 1986.

"A 166 Oversampling A/D Conversion Technology Using Triple Integration Noise Shaping" by Matsuya et al., 1987 IEE International Solid-State Circuits Conference, Digest of Technical Papers, Feb., 25, 1987.

"A Use of Double Integration in Sigma Delta Modulation" by Candy, IEEE Transactions on Communications, Vol. COM-33, No. 3, March, 1985.

"Special Report: High-Resolution Arrives for ADC Chips and Hybrids" by Riezenman, Electronics, Jan. 7, 1988, pp. 133-138.

Crystal Semiconductor Corporation data sheet for CSZ5316, Aug., 1987.

Primary Examiner—William M. Shoop, Jr.
Assistant Examiner—Brian Young
Attorney, Agent, or Firm—Robert L. King

[57] ABSTRACT

A noise shaping modulator for use in sigma delta modulation data conversion has two or more cascaded quantization loops. A first quantization loop is operated at a first sampling frequency and one or more higher order quantization loops are operated at a second sampling frequency. Due to speed limitations of analog circuitry in the first quantization loop, a significant improvement in signal to noise ratio may be achieved in a sigma delta modulation data converter by selecting the second sampling frequency higher than the first sampling frequency.

9 Claims, 3 Drawing Sheets

MULTI-RATE CASCADED NOISE SHAPING MODULATOR

CROSS REFERENCE TO RELATED APPLICATIONS

1. Application Ser. No. 07/147,958, entitled "A MULTIPLE OUTPUT OVERSAMPLING A/D CONVERTER WITH EACH OUTPUT CONTAINING DATA AND NOISE", filed Jan. 25, 1988 by Nicholas van Bavel and Tim A. Williams.
2. U.S. Pat. No. 4,843,390, entitled "AN OVERSAMPLED A/D CONVERTER HAVING DIGITAL ERROR CORRECTION", filed Feb. 23, 1988 by Nicholas van Bavel and Tim. A. Williams.
3. Application Ser. No. 07/172,823 entitled "AN OVERSAMPLED A/D CONVERTER USING FILTERED, CASCADED NOISE SHAPING MODULATORS", filed Mar. 25, 1988 by Nicholas van Bavel and Tim A. Williams.

FIELD OF THE INVENTION

This invention relates generally to the field of data conversion systems, and more particularly, to oversampling data converters for performing A/D conversion.

BACKGROUND OF THE INVENTION

A known type of data converter for performing A/D conversion with high resolution may be referred to as sigma delta modulation. A sigma delta converter having cascaded feedback loops is taught in U.S. Pat. No. 4,704,600 entitled "An Oversampling Converter" by Uchimura et al. Uchimura et al. have taught the use of a multi-stage converter which performs an integration of an analog input signal with feedback to move quantization error from the passband frequency range to higher frequencies. It is known that the cascading of sigma delta modulators provides high performance A/D conversion. Known oversampling converters, including the Uchimura converter, typically operate at a single predetermined high sampling frequency. A potentially troublesome portion of a sigma delta modulator is an analog integrator circuit which is used to implement the modulation. The analog integrator must be designed to fully settle or resolve an output at a high sampling frequency. Since the integrator is an analog circuit, a slow clock rate is desirable to allow the circuit as much time to settle as possible. However, if the sampling rate of the modulator is reduced to accomodate the need for a slow clock rate for the integrator, a significant increase in output quantization noise results. For example, in a double integration sigma delta converter an increase in noise of 15 dB per octave results as explained by James Candy in "A Use of Double Integration in Sigma Delta Modulation", IEEE Transactions on Communications, Vol. Com-33, No. 3, March 1985, pages 249–258. Therefore, the analog integrator must be a very high performance analog circuit to perform at high sampling frequencies required to achieve desired conversion performance.

BRIEF DESCRIPTION OF THE INVENTION

Accordingly, it is an object of the present invention to provide an improved multi-rate cascaded noise shaping modulator.

It is another object of the present invention to provide an improved analog to digital converter.

Yet another object of the present invention is to provide an improved method of data conversion in an oversample data converter.

In carrying out these and other objects of the invention, there is provided, in one form, a multi-rate cascaded noise shaping modulator operating at a plurality of sampling frequencies. Each of the sampling frequencies is greater than an input signal frequency. The modulator has an input for receiving an analog input signal and an output for providing an equivalent digital output signal. The modulator has a plurality of quantization loops comprising at least first and second loops. Each loop comprises an integrator, a quantizer and a feedback portion. The integrator integrates a difference between an input terminal signal and a feedback signal. The quantizer quantizes an output from the integrator and provides a loop output signal. The feedback portion has an input coupled to the loop output signal and an output for providing the feedback signal. The first quantization loop operates at a first sampling frequency and the second quantization loop operates at a second sampling frequency which is higher than the first sampling frequency.

These and other objects, features and advantages will be more clearly understood from the following detailed description taken in conjunction with the accompanying drawings.

DETAILED DESCRIPTION OF THE INVENTION

Figure 1:
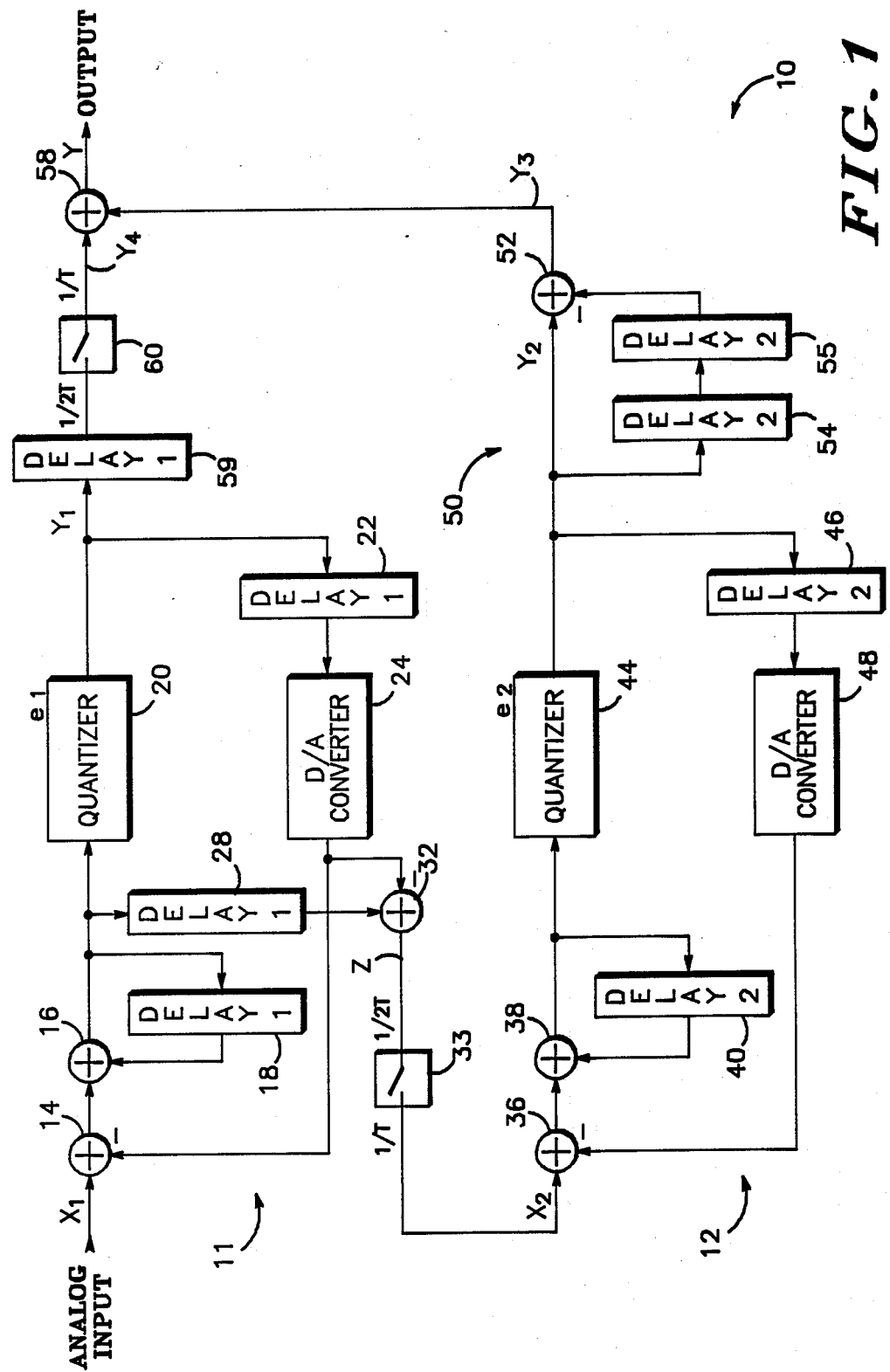
FIG. 1 illustrates in block diagram form a sigma delta data converter in accordance with the present invention.

Shown in FIG. 1 is a multi-rate cascaded A/D converter 10 generally comprising a first quantization loop 11 and a second quantization loop 12. A first quantization loop 11 comprises a subtractor circuit 14 having a first input for receiving an analog input signal, say $X_1$, a second input signal and an output. The output of subtractor circuit 14 is connected to a first input of an adder circuit 16. An output of adder circuit 16 is connected to an input of a delay circuit 18 having a delay period $D_1$. An output of delay circuit 18 is connected to a second input of adder circuit 16. The output of adder circuit 16 is also connected to an input of a quantizer circuit 20. An output of quantizer circuit 20 provides a signal labeled "$Y_1$" and is connected to a delay circuit 22 having a delay period $D_1$. An output of delay circuit 22 is connected to an input of a D/A converter 24. D/A converter 24 has an output connected to a second input of subtractor circuit 14. An output of adder circuit 16 is also connected to an input of a delay circuit 28 having a delay period D1. An output of delay circuit 28 is connected to a first input of a subtractor circuit 32. An output of D/A converter 24 is also connected to a second input of subtractor circuit 32. An output of subtractor circuit 32 provides a signal labeled "Z" and is connected to an input of an interpolator circuit 33 which changes the signal frequency by a factor of two. Factors other than two may be provided by making slight modifications to converter 10.

Second quantization loop 12 comprises a subtractor circuit 36 having a first input connected to an output of interpolator circuit 33. An output of subtractor circuit 36 is connected to a first input of an adder circuit 38. An output of adder circuit 38 is connected to an input of a delay circuit 40 having a delay period $D_2$. An output of delay circuit 40 is connected to a second input of adder circuit 38. The output of adder circuit 38 is also connected to an input of a quantizer circuit 44 having an error e2 associated therewith. An output of quantizer circuit 44 provides a signal labeled "$Y_2$" and is connected to an input of a delay circuit 46 having a delay period $D_2$. An output of delay circuit 46 is connected to an input of a D/A converter 48. An output of D/A converter 48 is connected to a second input of subtractor circuit 36. An output of quantizer circuit 44 is connected to an input of a differentiator circuit 50. Differentiator circuit 50 comprises a subtractor circuit 52 and delay circuits 54 and 55 which each have a delay period $D_2$. The output of quantizer 44 is connected to both a first input of adder circuit 52 and an input of delay circuit 54. An output of delay circuit 54 is connected to an input of delay circuit 55. An output of delay circuit 55 is connected to a second input of subtractor circuit 52. An output of subtractor circuit 52 is connected to a first input of an adder circuit 58. An output of quantizer 20 of first quantization loop 11 is connected to an input of a delay circuit 59 having a delay period $D_1$. An output of delay circuit 59 is connected to an input of an interpolator circuit 60 which functions to change the frequency of delayed signal Y1 from the sampling frequency $[1/(2T)]$ to $(1/t)$. An output of interpolator circuit 60 provides a signal Y4 and is connected to a second input of adder circuit 58. An output of adder circuit 58 provides a digital output signal labeled "Y".

In the illustrated form, A/D converter 10 is a second order cascaded multi-rate sigma delta modulator which operates at two different clock sampling rates. It should be well understood that the present invention may also be utilized with third order and higher order cascaded sigma delta modulators. Also, the present invention may be used in conjunction with other forms of sigma delta modulation converters including converters having modulators which feed forward only the output of an integrator as taught in FIG. 7 of my copending U.S. patent application Ser. No. 07/147,958 referenced above. First quantization loop 11 operates at a predetermined oversampling frequency and second quantization loop 12 operates at a higher oversampling rate. The delay circuits of quantization loop 11 are clocked at a frequency of $(\frac{1}{2} T)$ and the delay circuits of quantization loop 12 are clocked at a frequency of $(1/T)$. It can be readily shown that the output of quantization loop 11 may be represented by:

$$Y_1 = \frac{X_1 - Y_1 D_1}{1 - D_1} + e_1 \quad (1)$$

where $[1/(1-D_1)]$ represents the integration of the difference signal $(X_1 - Y_1 D_1)$ performed by adder circuit 16 and delay circuit 18 which function as an integrator. It should be noted that adder circuit 16 and delay circuit 18 function as a filtering device to modify the difference signal. For higher ordered quantization loops may not necessarily function exactly as an integrator but in general as a signal filter to modify the difference signal. The expression "e1" represents a quantization error associated with quantizer 20 which functions to convert analog signals connected to the input thereof to equivalent digital signals. Equation one may be rewritten as:

$$Y_1 = S_1 + e_1(1 - D_1) \quad (2)$$

First quantization loop 11 provides a signal Z from the output of subtractor 32 which functions as an input terminal signal fro second quantization loop 12. Signal Z is the difference of the input to quantizer 20 and the output of quantizer which is reconverted to analog form. The remainder is simply the quantization error of quantizer 20 which is delayed by a period of $(\frac{1}{2} T)$ by delay circuit 22. Therefore, signal Z may be represented as:

$$Z = -e_1 D_1. \quad (3)$$

Interpolator circuit 33 functions to change the frequency of signal Z from the sampling frequency of $[1/(2T)]$ to $(1/t)$. The output of interpolator circuit 33 is signal $X_2$ which functions as the input terminal signal for second quantization loop 12. Signal $X_2$ is the same as signal Z but has a sampling frequency which is twice the sampling frequency of signal $X_2$ due to interpolator circuit 33. Therefore, $$X_2 = e_1(D_2)^2 \quad (4)$$

where $(D_2)^2$ equals $D_1$. The relationship between $D_2$ and $D_1$ may be more readily understood by realizing that since $D_1$ is a delay clocked at the rate of $(\frac{1}{2} T)$ and $D_2$ is a delay which is clocked at the rate of $(1/T)$, each may be represented in the frequency domain as:

$$D_1 = e^{-jw2T} \text{ and} \quad (5)$$

$$D_2 = e^{-jw2T}. \quad (6)$$

Therefore, $$(D_2)^2 = e^{-jw2T} = D_1. \quad (7)$$

The output of second quantization loop 12 is signal Y2 which may be represented as:

$$Y_2 = \frac{X_2 - Y_2 D_2}{1 - D_2} + e_2 \quad (8)$$

where $[1/(1-D_2)]$ represents the integration implemented by adder circuit 38 and delay circuit 40. Equation eight may be further simplified as:

$$Y_2 = X_2 + e_2(1 - D_2). \quad (9)$$

Substituting the expression for $X_2$ found in equation 4, equation 9 may be rewritten as:

$$Y_2 = e_1(D_2)^2 + e_2(1 - D_2). \quad (10)$$

Signal Y2 is differentiated by adder circuit 52 and delay circuit 54 which function together as a differentiator. Delay circuit 54 provides a delay equivalent to the mathematical square of the delay period $D_2$. The output of adder circuit 52, signal Y3, may be represented as:

$$Y_3 = Y_2[1 - (D_2)^2] \quad (11)$$

Before signal $Y_1$ is coupled to adder 58, signal $Y_1$ is delayed by delay circuit 59 and the sampling frequency is reduced by interpolator 60. The output of interpolator 60, signal $Y_4$, may be repsented as:

$$Y_4 = X_1(D_2)^2 + e_1[1 - (D_2)^2](D_2)^2. \quad (12)$$

The output signal Y of A/D converter 10 is the sum of signals $Y_3$ and signal $Y_4$. Output signal Y may be represented as:

$$Y = Y_4 + Y_3. \quad (13)$$

By substituting previously derived expressions for $Y_4$ and $Y_3$ into equation 13 and solving, signal Y becomes:

$$Y = S_1(D_2)^2 + e_1[(1-(D_2)^2](D_2)^2 - e_1[1-(D_2)^2[(D_2)^{-2} + e_2(1-D_2)[1-(D_2)^2] \quad (14)$$

By simplifying equation 14 and realizing that:
$$(1-D_2)[1-(D_2)^2] = (1-D_2)^2(1+D_2) \quad (15)$$

signal Y may be represented by:

$$Y - X_1(D_2)^2 + e_2(1-D_2)^2(1+D_2). \quad (16)$$

It can be readily seen that output signal Y comprises a data term X1 which has been delay and a second order error term.

In comparison, when a conventional two cascaded quantization loop sigma delta modulator such as the modulator illustrated in my copending U.S. patent application Ser. No. 07/159,858 entitled "An Oversampled A/D converter Having Digital Error Correction" and referenced above, the ouput signal may be represented by:

$$Y = X_1(D_1)^2 + e_2(1-D_1)^2 \quad (17)$$

When comparing the signal to noise ratio of the output signal of converter 10 of the present invention to known sigma delta converters the output signal operates at a significantly higher rate of speed. Since it is well known that signal to noise ratio can be improved by increasing the amount of oversampling, it can be readily shown that the signal to noise ratio of the output signal of equation 16 is nine decibels higher than the signal to noise ratio of the output signal of a known converter as represented by equation 17. The increased performance would actually be about fifteen decibels higher, or twice the frequency, were it not for the fact that 6 decibels are lost due to the $(1+D_2)$ term in equation sixteen.

It should be well understood that the present invention may be implemented in any sigma delta modulator structure and for any order of modulator. For example, higher order known modulators contain multiple integrators in each quantization loop. In sigma delta modulator A/D converters which do not have a single output signal but which provide multiple outputs, such as disclosed in my copending U.S. patent application Ser. No. 07/147/958 referenced above, a significant increase in signal to noise ratio may be realized by operating second and higher order quantization loops if any, at higher sampling frequencies than the first quantization loop's sampling frequency.

Figure 2:
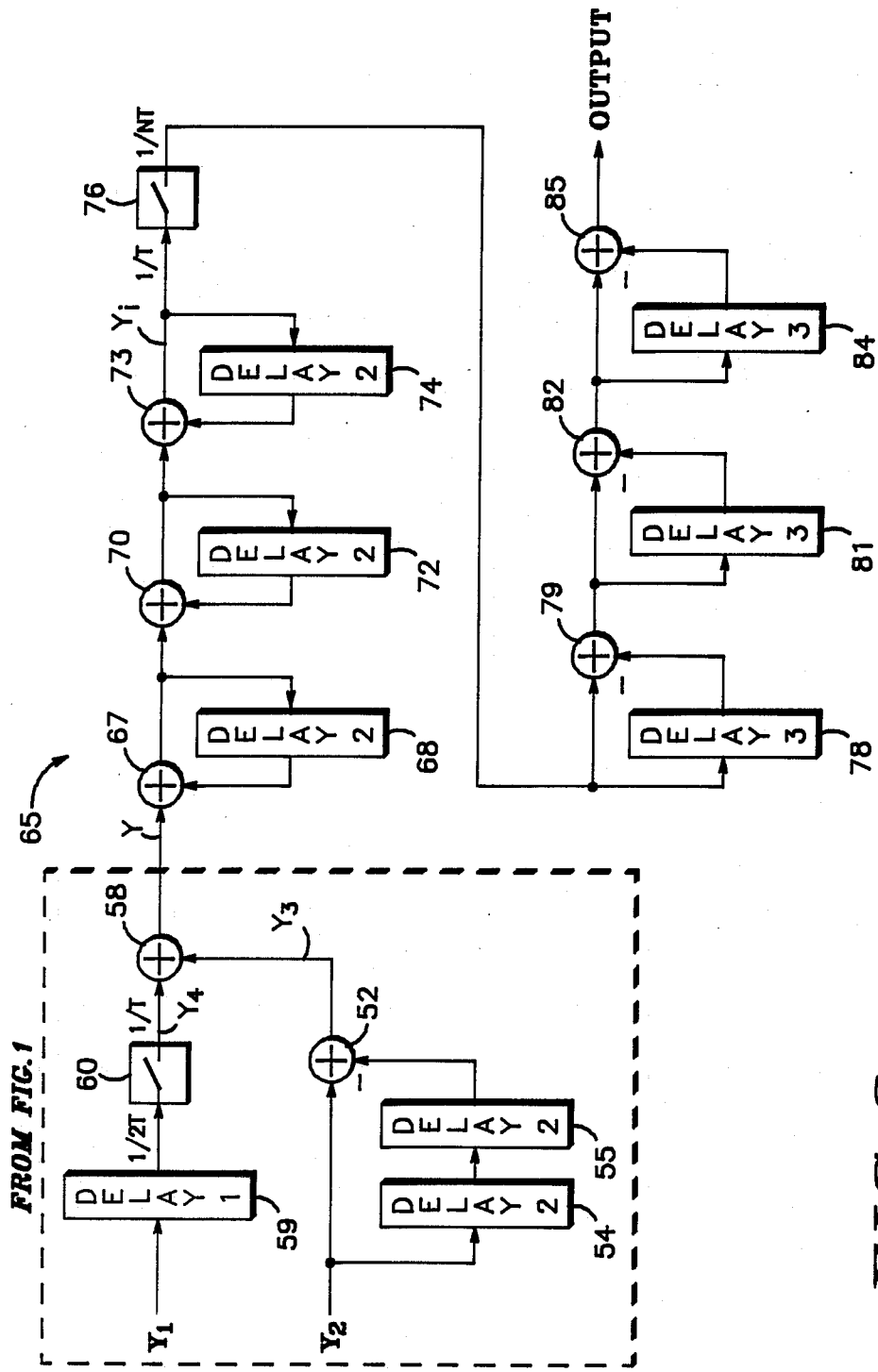
FIG. 2 illustrates a known decimation filter for use with the converter of FIG. 1.

Shown in FIG. 2 is a known decimation filter 65 which may be used in conjunction with the output of A/D converter 10. For purposes of illustration only, some of the elements of converter 10 are duplicated to correlate the interfacing with filter 65. As previously stated, input signal Y1 is coupled to the input of delay circuit 59 having delay period $D_1$. The output of delay circuit 59 is a signal having a period of ($\frac{1}{2}$ T). Interpolator 60 has an input connected to the output of delay circuit 59. An output of interpolator 60, which is a signal having a period of (1/T), is connected to the second input of adder 58. Input signal Y2 is coupled to both the first input of subtractor 52 and the input of delay circuit 54. The output of delay circuit 54 is connected to the input of delay circuit 55, and the output of delay circuit 55 is connected to the second input of subtractor 52. The output of subtractor 52 provides signal Y2 and is connected to the first input of adder 58.

Decimation filter 65 comprises an adder 67 having a first input connected to the output of adder 58. An output of adder 67 is connected to both an input of a delay circuit 68 and to a first input of an adder 70. An output of delay circuit 68 is connected to a second input of an adder 67. An ouput of adder 70 is connected to both an input of a delay circuit 72 and to a first input of an adder 73. An output of delay circuit 72 is connected to a second input of adder 70. An output of adder 73 provides a signal Yi at a signal rate of (1/T) and is connected to both an input of a delay circuit 74 and to an input of a decimator 76. An output of delay circuit 74 is connected to a second input of adder circuit 73. An output of decimator 76 provides a signal a rate of (1/NT) where N is an integer. Delay circuits 68, 72 and 74 each has a delay element labeled "Delay 2". The output of decimator 76 is connected to both an input of delay circuit 78 and a first input of an adder circuit 79. An output of delay circuit 78 is connected to a second input of adder circuit 79. An output of adder circuit 79 is connected to both an input of a delay circuit 81 and a first input of an adder 82. An output of delay circuit 81 is connected to a second input of adder 82. An output of adder 82 is connected to an input of delay circuit 84 and to a first input of an adder 85. An output of delay circuit 84 is connected to a second input of adder 85. An output of adder circuit 85 provides a filter output signal. Delay circuits 78, 81 and 84 each has a delay element labeled "Delay 3".

In operation, delay circuit 59 delays input signal Y1 and interpolator 60 increases the frequency of signal Y1 by a factor of two. Delay circuits 54 and 55 and adder 52 function to differentiate signal Y2 so that a differentiated version of signal Y2 is summed with the modified signal Y1. Delay circuit 68 and adder 67 function together as a signal integrator to integrate the output of adder 58. Similarly, adder 70 and delay circuit 72 function as an integrator as do adder 73 and delay circuit 74. The output of adder 58 is integrated three times and coupled to decimator 76 which reduces the signal frequency by an integer factor of N. Delay circuit 78 and adder 79 function in combination as a differentiator. Similarly, delay circuit 81 and adder 82 functions as a differentiator as do delay circuit 84 and adder 85. Therefore, in the course of decimating the output of adder 58, filter 65 integrates the output of adder 58 three times and differentiates the output of adder 58 three times. It can be readily shown that the signal Yi which is coupled to decimator 76 may be represented as:

$$Y_i = \frac{Y_1(D_2)^2 + Y_2[1 - (D_2)^2]}{(1 - D_2)^3} \quad (18)$$

where the expression $(D_2)^2$ equals $D_1$.

Figure 3:
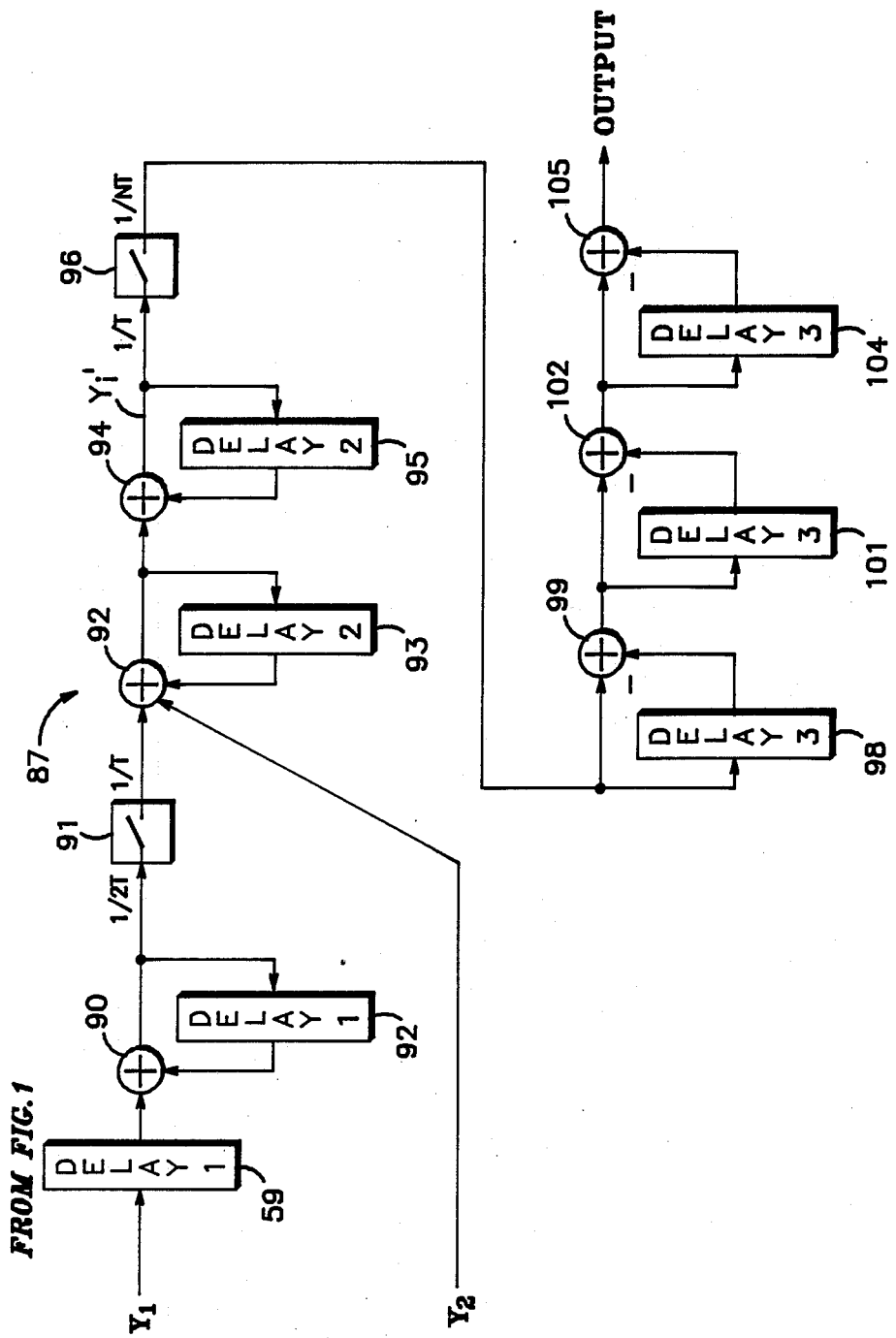
FIG. 3 illustrates a decimation filter in accordance with the present invention for use with the converter of FIG. 1.

Shown in FIG. 3 is a decimation filter 87 for use with A/D converter 10. As with FIG. 2, a portion of converter 10 is shown interfacing with filter 87. However, converter 10 is structurally modified when interfaced with filter 87. Signals Y1 and Y2 provided by converter 10 are utilized in a manner modified from that illustrated in FIG. 1. An input of delay circuit 59 is connected to signal Y1 as in FIG. 1. However, the output of delay circuit 59 is connected to a first input of an adder 90. An output of adder 90 is connected to both an input of an interpolator 91 and an input of a delay circuit 92. Adder 90 provides an output signal having a period of ($\frac{1}{2}$ T), where T is an integer. An output of delay circuit 92 is connected to a second input of adder 90. Both of delay circuits 59 and 92 provide a first delay period labeled "delay 1". An output of interpolator 91 provides a signal having a period of (1/T) and is connected to a first input of an adder 92. A second input of adder 92 is coupled to signal Y2 provided by quantizer 44 of converter 10 of FIG. 1. An output of adder 92 is connected to both an input of a delay circuit 93 for providing a second delay labeled "delay 2" and to a first input of an adder 94. An output of delay circuit 93 is connected to a second input of adder 92. An output of adder 94 provides a signal labeled (Yi)' having a period of (1/T) and is connected to both an input of a delay circuit 95 and to an input of an interpolator 96. An output of delay circuit 95 s connected to second input of adder 94. Interpolator 96 provides a signal having a period of (1/NT) and is connected to both an input of a delay circuit 98 and to an input of an adder 99. Delay circuit 98 provides a third delay period labeled "delay 3". An output of delay circuit 98 is connected to both an input of a delay circuit 101 and to a first input of an adder 102. Delay circuit 101 provides a delay equal to the third delay period. An output of delay circuit 101 is connected to a second input of adder 102. An output of adder 102 is connected to both an input of a delay circuit 104 and to a first input of an adder 105. Delay circuit 104 also provides a delay equal to the third delay period. An output of delay circuit 104 is connected to a second input of adder 105. An output of adder 105 provides an output of decimation filter 87.

In operation, signal Y1 is delayed by a delay period $D_1$ and then integrated rather than interpolated as was done in FIG. 2. However, the integration occurs at the rate of delay period one. The integrated signal is then interpolated and increased in frequency from a period of ($\frac{1}{2}$ T) to (1/T). The output of interpolator 91 is combined with signal Y2 and integrated twice more at a second rate. Signal (Yi)' is then decimated to a rate of (1/NT) and differentiated by three stages of differentiators as in filter 65. Signal (Yi)' may be represented by the following expression:

$$(Yi)' = \frac{\frac{Y1(D2)^2}{1-(D2)^2} + Y2}{(1-D2)^2} \tag{19}$$

Equation 19 may be further expressed as:

$$(Yi)' = \frac{Y1(D2)^2 + Y2[1-(D2)^2]}{[1-(D2)^2](1-D2)^2} \tag{20}$$

For purposes of more readily comparing equation 20 with equation 18, equation 20 may be rewritten as:

$$(Yi)' = \frac{Y1(D2)^2 + Y2[1-(D2)^2]}{[1-(D2)]^3(1+D2)} \tag{21}$$

When equation 21 representing signal (Yi)' of filter 87 is compared with equation 18 representing signal (Yi) of filter 65, it is apparent that the only difference in the two signals is the term (1+D2) in the denominator of equation 21. The term [1/(1+D2)] represents a frequency pole in a low pass filter function in the frequency domain which does not degrade the filter performance since a low pass filter function is being implemented by filter 87. Filter stability is not affected by the additional term provided the decimation rate N is an even integer.

In the illustrated form, filter 87 is incorporated into converter 10 by placing an integrator comprising adder 90 and delay circuit 92 before an interpolation from frequency ($\frac{1}{2}$ T) to (1/T) is made. Therefore, the integrator comprising adder 90 and delay circuit 92 operates at the first signal rate, ($\frac{1}{2}$ T), which is the same as delay circuit 50 of converter 10. The integrator will be easier to design when operating at the lower frequency. The summing point where the signals Y1 and Y2 of the cascaded loops of converter 10 are added has been relocated from converter 10 into filter 87. More particularly, signal Y2 is connected directly to an adder to be summed with signal Y1. By using filter 87 of FIG. 3 with converter 10 of FIG. 1, the differentiator of converter 10 which is implemented by adder 52 and delay circuits 54 and 55 is not required. This fact can be further understood by realizing from FIG. 2 that the net effect in the frequency domain of the differentiation of signal Y2 by adder 52 and delay circuits 54, 55 and the integration of signal Y2 by adder 67 and delay circuit 68 is to couple signal Y2 directly to adder 70. Although signals Y2 and Y1 have different signal rates initially, when adder 92 combines the signals both signals have the same frequency. Therefore, circuitry in converter 10 is reduced while circuitry in filter 87 is used for multiple purposes. Significant savings in circuit size are thereby achieved.

By now it should be apparent that a multi-rate cascaded noise shaping modulator has been provided. By operating a first quantization loop at a slower sampling rate than higher order quantization loops, additional settling time is provided for analog circuitry in the first quantization loops. Therefore, higher signal to quantization noise ratio is achieved due to increase oversampling of the input signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A multi-rate cascaded noise shaping modulator operating at a plurality of sampling frequencies, each greater than an input signal frequency, said modulator having an input for receiving an analog input signal and an output for providing an equivalent digital output signal, comprising:

at least first and second quantization loops, each quantization loop comprising:

means for filtering a difference between an input terminal signal and a feedback signal;

a quantizer for quantizing an output from an integrator and providing a loop output signal; and feedback means having an input coupled to the loop output signal and an output for providing the feedback signal;

said first quantization loop operating at a first sampling frequency and said second quantization loop operating at a second sampling frequency which is higher than the first sampling frequency.

2. The multi-rate cascaded noise shaping modulator of claim 1 wherein the second sampling frequency has a magnitude which is an integer multiple of two or more than the first sampling frequency.

3. The multi-rate cascaded noise shaping modulator of claim 2 wherein the means for filtering performs an integration of the difference between the input terminal signal and the feedback signal.

4. A multi-rate cascaded noise shaping modulator which operates at sampling frequencies which are each greater than an input signal frequency, said noise shaping modulator having an output for providing an equivalent digital output signal, comprising:

first quantization loop means having an input for receiving an analog input signal and comprising:
  a first subtractor circuit having a first input for receiving the analog input signal, a second input and an output;
  a first adder having a first input coupled to the output of the first subtractor circuit, a second input and an output;
  a first delay having an input coupled to the output of the first adder, and an output coupled to the second input, said first delay circuit having a first predetermined delay;
  a first quantization circuit having an input coupled to the output of said first adder, and an output for providing a digital equivalent signal of the output of the first adder with a first error associated therewith;
  a second delay circuit having an input coupled to the output of the first quantization circuit, and an output, said second delay circuit having the first predetermined delay;
  a first digital-to-analog converter having an input coupled to the output of the second delay circuit, and an output coupled to the second input of the first subtractor circuit, for converting the digital equivalent signal provided by the first quantization circuit to an analog signal;

second quantization loop means having an input coupled to the first quantization loop means, comprising:
  a second subtractor circuit having a first input coupled to the first quantization loop means, a second input and an output;
  a second adder having a first input to the output of the second subtractor circuit, a second input and an output;
  a third delay circuit having an input coupled to the output of the second adder, and an output coupled to the second input of the second adder, said third delay circuit having a second predetermined delay;
  a second quantization circuit having an input coupled to the output of said second adder, and an output for providing a digital equivalent signal of the output of the second adder with a second error associated therewith;
  a fourth delay circuit having an input coupled to the output of the second quantization circuit, and an output, said fourth delay circuit having the second predetermined delay; and
  a second digital-to-analog converter having an input coupled to the output of the fourth delay circuit, and an output coupled to the second input of the second subtractor circuit, for converting the digital equivalent signal provided by the second quantization circuit to an analog signal;

coupling means for coupling the first quantization loop means to the second quantization loop means and changing signal frequency of the modulator from a first signal frequency used in the first quantization loop means to a second signal frequency greater than the first signal frequency for use in the second quantization loop means; and output means coupled to the first and second quantization loop means, for making signal frequency of outputs of the first and second quantization circuits substantially the same and adding the outputs to provide the equivalent digital output signal.

5. The multi-rate cascaded noise shaping modulator circuit of claim 4 wherein the coupling means further comprise:
  a fifth delay circuit having an input coupled to the output of the first adder, and an output, said fifth delay circuit having the first predetermined delay;
  a third adder having a first input coupled to the output of the fifth delay circuit, a second input coupled to the output of the first digital-to-analog converter, and an output; and
  an interpolator circuit having an input coupled to the output of the third adder, and an output coupled to the first input of the second subtractor circuit, said interpolator circuit changing the signal frequency from the first signal frequency to the second signal frequency.

6. The multi-rate cascaded noise shaping modulator circuit of claim 4 wherein the output means further comprise:
  a fifth delay circuit having an input coupled to the output of the first quantization circuit, and an output, said fifth delay circuit having the first predetermined delay;
  an interpolator circuit having an input coupled to the output of circuit changing the signal frequency of the output of the first quantization circuit from the first signal frequency to the second signal frequency;
  a third adder having a first input coupled to the output of the interpolator circuit, a second input, and an output for providing the equivalent digital output signal;
  a sixth delay circuit having an input coupled to the output of the second quantization circuit, and an output, said sixth delay circuit having the second predetermined delay;
  a seventh delay circuit having an input coupled to the output of the sixth delay circuit, and an output, said seventh delay circuit having the second predetermined delay:
  a fourth adder having a first input coupled to the output of the second quantization circuit, a second input coupled to the output of the seventh delay circuit, and an output coupled to the second input of the third adder.

7. The multi-rate cascaded noise shaping modulator circuit of claim 4 wherein the first predetermined delay is substantially one period of the first signal frequency and the second predetermined delay is substantially one period of the second signal frequency.

8. The multi-rate cascaded noise shaping modulator circuit of claim 5 wherein the first predetermined delay is substantially one period of the first signal frequency and the second predetermined delay is substantially one period of the second signal frequency.

9. The multi-rate cascaded noise shaping modulator circuit of claim 6 wherein the first predetermined delay is substantially one period of the first signal frequency and the second predetermined delay is substantially one period of the second signal frequency.

* * * * *